(12) United States Patent
Prabhakar et al.

(10) Patent No.: US 8,897,067 B2
(45) Date of Patent: Nov. 25, 2014

(54) NONVOLATILE MEMORY CELLS AND METHODS OF MAKING SUCH CELLS

(71) Applicant: Cypress Semiconductor Corporation, San Jose, CA (US)

(72) Inventors: Venkatraman Prabhakar, Pleasanton, CA (US); Kaveh Shakeri, Campbell, CA (US); Long T Hinh, San Jose, CA (US); Sarath C. Puthenthermadam, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/795,036

(22) Filed: Mar. 12, 2013

(65) Prior Publication Data

US 2014/0264552 A1   Sep. 18, 2014

Related U.S. Application Data

(60) Provisional application No. 61/754,076, filed on Jan. 18, 2013.

(51) Int. Cl.
*G11C 14/00* (2006.01)
*H01L 27/07* (2006.01)
*H01L 29/66* (2006.01)

(52) U.S. Cl.
CPC ...... *H01L 27/0705* (2013.01); *H01L 29/66833* (2013.01)
USPC ..................................... 365/185.08; 365/154

(58) Field of Classification Search
USPC ............................................ 365/154, 185.08
See application file for complete search history.

(56) References Cited

U.S. PATENT DOCUMENTS

| 5,065,362 | A | * | 11/1991 | Herdt et al. .................... 365/154 |
| 5,496,756 | A | | 3/1996 | Sharma et al. |
| 5,790,452 | A | | 8/1998 | Lien |
| 6,998,309 | B2 | | 2/2006 | Cho et al. |
| 7,964,459 | B2 | | 6/2011 | Lusky et al. |
| 8,324,052 | B2 | | 12/2012 | Oh et al. |
| 2004/0185609 | A1 | | 9/2004 | Okumura et al. |
| 2008/0013377 | A1 | | 1/2008 | Sel et al. |
| 2008/0043516 | A1 | * | 2/2008 | Dalton .......................... 365/154 |
| 2008/0212373 | A1 | * | 9/2008 | Hasegawa et al. ........ 365/185.17 |
| 2008/0237745 | A1 | | 10/2008 | Yang et al. |
| 2009/0027964 | A1 | * | 1/2009 | Arai .......................... 365/185.05 |
| 2009/0168513 | A1 | | 7/2009 | Tanaka |
| 2009/0190402 | A1 | * | 7/2009 | Hsu et al. .................. 365/185.08 |
| 2012/0205734 | A1 | * | 8/2012 | Horch .......................... 257/315 |

OTHER PUBLICATIONS

Choi et al., Investigation of Gate-Induced Drain Leakage (GIDL) Current in Thin Body Devices: Single Gate Ultra-Thin Body, Symmetrical Double-Gate, and Asymmetrical Double-Gate MOSFETs, Jpn. J. Appl. Phys., Apr. 2003, pp. 2073-2076, vol. 42, Part I, No. 4B.

* cited by examiner

*Primary Examiner* — Hoai V Ho (57) ABSTRACT

A memory cell can include at least a first programmable section coupled between a supply node and a first data node; a volatile storage circuit coupled to the first data node; and the programmable section includes a programmable transistor having a first source/drain (S/D) region shared with a first transistor, and a second S/D region shared with a second transistor; wherein the first S/D region has a different dopant diffusion profile than the second S/D region, and the programmable transistor has a charge storage structure formed between its control gate and its channel. Methods of forming such a memory cell are also disclosed.

7 Claims, 9 Drawing Sheets

NONVOLATILE MEMORY CELLS AND METHODS OF MAKING SUCH CELLS

CROSS-REFERENCE TO RELATED APPLICATIONS

This application claims priority to U.S. Provisional Patent Application No. 61/754,076, filed Jan. 18, 2013.

TECHNICAL FIELD

The present disclosure relates generally to nonvolatile memory cells, and more particularly to nonvolatile memory cells having pairs of programmable transistors with charge storage structures to vary their threshold voltages.

BACKGROUND

Figure 12A:
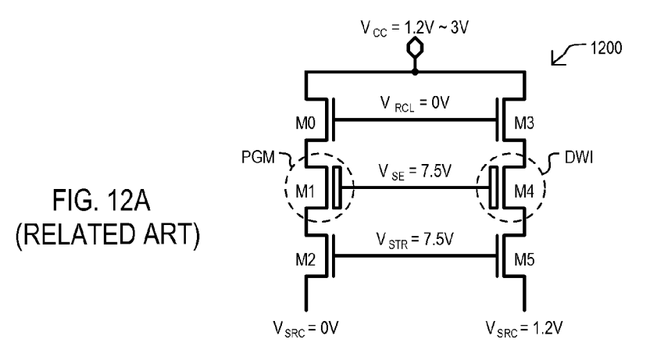
FIG. 12A is a schematic diagram showing biasing conditions for a conventional NV SRAM cell that can give rise to DWI disturb.

FIG. 12A shows a portion of a conventional nonvolatile static random access memory (NVSRAM) cell 1200 having "recall" transistors M0/M3, matching "store" transistors M2/M5 and silicon-oxide-nitride-oxide-silicon (SONOS) type transistors M1/M4. The SONOS type transistors (M1/M4) can be programmed to different threshold voltages (Vts) to store a data value in the memory cell 1200. Variations in Vt are achieved by accumulating charge in the gate dielectric structure of the SONOS transistor.

FIG. 12A shows biasing conditions for conventional memory cell 1200 that can program SONOS transistor M1 to a higher threshold voltage than SONOS transistor M4. Conventionally, such biasing conditions can result in a dynamic write inhibit (DWI) disturb of the SONOS transistor not being programmed to the higher threshold voltage (i.e., M4). DWI disturb can undesirable increase the threshold voltage of transistor M4.

As transistor sizes and/or threshold voltages decrease, DWI disturb can make conventional NVSRAM 1200 designs unsuitable for desired applications, as a threshold voltage difference between SONOS transistors M1 and M4 is not sufficiently large enough to meet reliability specifications (i.e., data retention and/or endurance).

Figure 12B:
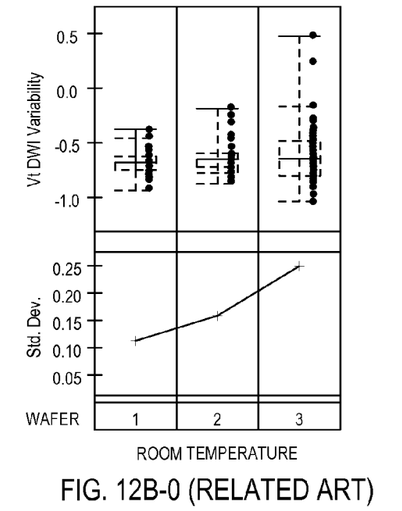
Figure 12B:
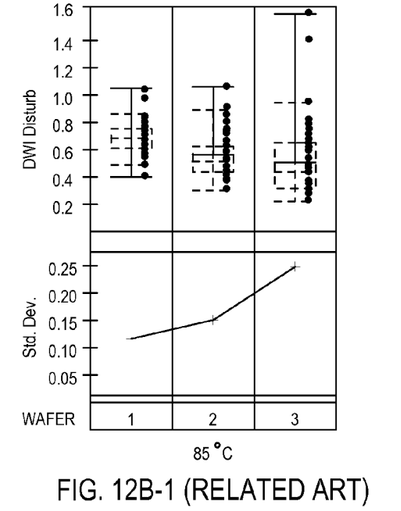

FIG. 12B-0 shows Vt variability for a DWI transistor (i.e., a SONOS transistor subject to DWI disturb) at room temperature (30° C.) for three wafers. Wafer 1 shows data for a conventional NVSRAM cell having source/drain regions formed with a source/drain (S/D) implant and lightly doped drain (LDD) implant. Wafers 2 and 3 show the same results for like memory cells, but with lower LDD doses. FIG. 12B-1 shows DWI disturb for a DWI transistor at an elevated temperature (85° C.) for three wafers. As in the case of FIG. 12B-0, wafer 1 shows data for a conventional NVSRAM cell having like source/drain regions, each including a source/drain (S/D) implant and lightly doped drain (LDD) implant, while wafers 2 and 3 show the same results for like memory cells, but with lower LDD doses.

As shown by FIGS. 12B-0/1, DWI disturb can be about 650 mV at 30° C. and can go up to about 1 volt at 85° C.

Figure 12C:
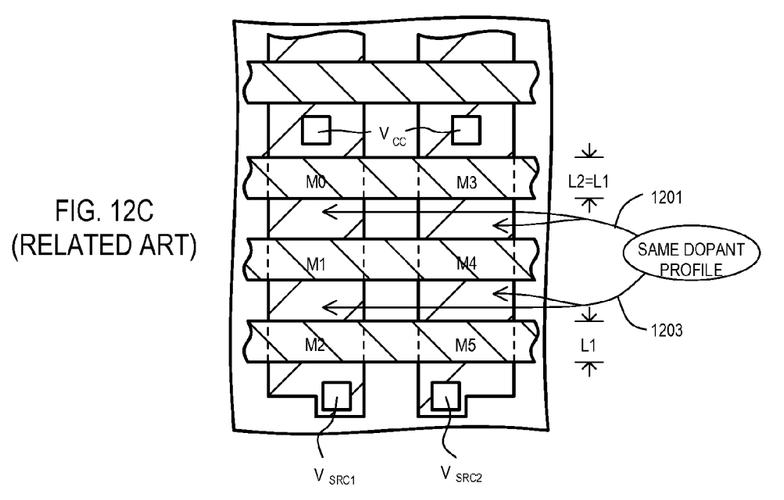
FIG. 12C is a layout of a section of a conventional NV SRAM cell.

FIG. 12C shows a layout for the conventional NVSRAM cell portion 1200 shown in FIG. 12A. Transistors M0/M2 and M3/M5 can have like gate lengths (L1=L2). Further, S/D diffusions 1201 between SONOS transistors M1/M4 and recall transistors M0/M3 can be the same as S/D diffusions 1203 between SONOS transistors M1/M4 and store transistors M2/M5. As noted above, such S/D diffusion regions 1201/1203 can be formed with a source-drain ion implantation step and an LDD ion implantation step.

BRIEF DESCRIPTION OF THE DRAWINGS

FIGS. 12B-0/1 are variability diagrams showing the effects of DWI disturb in conventional NV SRAM cells.

DETAILED DESCRIPTION

Various embodiments will now be described that include nonvolatile memory cells and methods of forming such cells. According to embodiments, a nonvolatile memory cell can include a pair of transistors programmable to different threshold voltages via a charge storage structure between a control gate and a channel. The programmable transistors can have asymmetric source/drain doping. In particular embodiments, a memory cell can include a pair of programmable transistors, each sharing a first source/drain (S/D) diffusion region with a first access transistor and a second S/D diffusion region with a second access transistor. First S/D diffusion regions can have a more graded p-n junction than the second S/D diffusion regions.

In very particular embodiments, a nonvolatile static random access memory (NV SRAM) cell can include first and second programmable sections, each including a programmable transistor having a first S/D diffusion region shared with a "recall" transistor, and second S/D diffusion region with a "store" transistor. The first S/D diffusion regions can have more graded p-n junctions than the second S/D diffusion regions.

Figure 1:
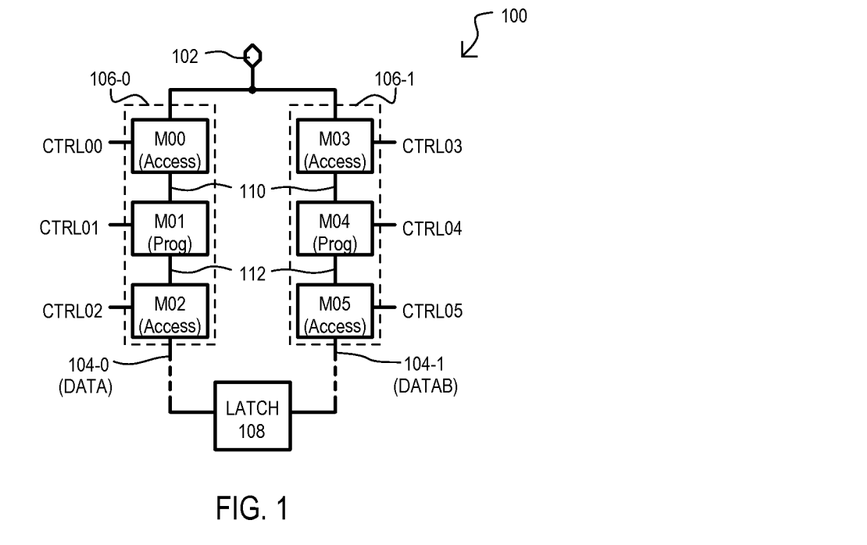
FIG. 1 is a block schematic diagram of a memory cell according to an embodiment.

FIG. 1 shows a nonvolatile memory cell 100 according to an embodiment. A memory cell 100 can include a first section 106-0, optionally a second section 106-1, and a latch circuit 108. A first section 106-0 can be connected between a supply node 102 and first data node 104-0. If included, a second section 106-1 can be connected between the supply node 102 and a second data node 104-1. First section 106-0 can include a first access transistor M00, a first programmable transistor M01, and a second access transistor M02. Second section 106-1 can have the same arrangement, including a third access transistor M03, a second programmable transistor M04, and a fourth access transistor M04. In particular embodiments, sections 106-0/1 can match one another, with transistors M00, M01 and M02 matching transistors M03, M04 and M05, respectively.

Within each section 106-0/1, each programmable transistor (M01/M04) can be programmed by setting its threshold voltage by application of appropriate biasing conditions. According to embodiments including one section, a data value can be stored in the memory cell 100 by establishing a threshold voltage in the programmable transistor of the section. According to embodiments including two sections, a data value can be stored by establishing a sufficient difference in threshold voltages between the two programmable transistors (M01/M04). In particular embodiments, such a programming can be nonvolatile, with the programmable transistor(s) maintaining the threshold shift in the absence of power.

In some embodiments, a programmable transistor (M01 and/or M04) can include a charge storing structure positioned between its control gate and its channel. Biasing conditions introduce charge into and/or remove charge from the charge storing structure to thereby establish a threshold shift. In some embodiments, a programmable transistor (M01 and/or M04) can include a multi-layer gate dielectric, including at least one insulating layer that serves as a charge storing structure or creates a charge storing interface. In a very particular embodiment, a programmable transistor (M01 and/or M04) can be a silicon-oxide-nitride-oxide-silicon (SONOS) type transistor.

First access transistors (M00/M03) can have source-drain paths connected between their respective programmable transistors (M01/M04) and supply node 102. Further, first access transistors (M0/M03) can share source/drain (S/D) diffusions 110 with their respective programmable transistors (M01/M04). In a similar fashion, second access transistors (M02/M05) can have source-drain paths connected between their respective programmable transistors (M01/M04) and data nodes 104-0/1, respectively. Second access transistors (M02/M05) can share source/drain (S/D) diffusions 112 with their respective programmable transistors (M01/M04).

Unlike the conventional device shown in FIGS. 12A and 12C, an S/D diffusion 110 (shared by transistors M00/M01 and M03/M04) can be different from S/D diffusions 112 (shared by transistors M01/M25 and M04/M05). In some embodiments, S/D diffusions 110 can have a more graded p-n junction than S/D diffusions 112. As will be shown in more detail below, in very particular embodiments, a more graded junction can be created by including dopants having a faster diffusion rate in S/D diffusions 110 as compared to the dopants of S/D diffusions 112. Accordingly, embodiments can be conceptualized as providing programmable transistor(s) (M01/M04) with asymmetric S/D diffusion regions, as S/D diffusions 110 are different than S/D diffusions 112.

Referring still to FIG. 1, in the particular embodiment shown, a memory cell 100 can include a latch circuit 108 connected, either directly or indirectly, to one data node (e.g., 104-0) in the event one section (106-0) is included, or both data nodes 104-0/1 in the event two sections 106-0/1 are included. In some embodiments, a latch circuit 108 can be placed into one of two stable states based on the threshold voltage of transistor M01. Alternatively, a latch circuit 108 can be placed into one of two stable states based on the threshold voltage difference between programmable transistors M01/M04. In some embodiments, a latch circuit 108 can be a volatile latch circuit, enabling fast access to a stored data value.

According to some embodiments, a memory cell 100 can have "store" and "recall" operations. In a store operation, for embodiments with one section (106-0), a threshold voltage can be established for one programmable transistor (e.g., M01). For embodiments with two sections (106-0/1), one or both programmable transistors M01/M04 can be programmed to create differences in their threshold voltages. It is understood that as used herein, the term "program" is not intended to imply a threshold shift in any particular direction (i.e., higher or lower). For example, for some programmable transistors, achieving a higher threshold voltage is accomplished with an "erase" operation. Thus, according to embodiments, differences in threshold voltages for transistors M01/M04 can be accomplished by programming one to a higher threshold voltage than the other, programming one to a lower threshold voltage than the other, or combinations thereof. In very particular embodiments, in a store operation, access transistor(s) M00/M03 can be off and transistor(s) M02/M05 can be on, allowing bias conditions to be applied to data nodes 104-0/1.

In a recall operation, according to a state of programmable transistor(s) M01/M04, a data value can be latched within latch circuit 108. In very particular embodiments, in a recall operation, access transistor(s) M00/M03 and M02/M05 can be turned on, and supply node 102 can be biased.

Figure 2:
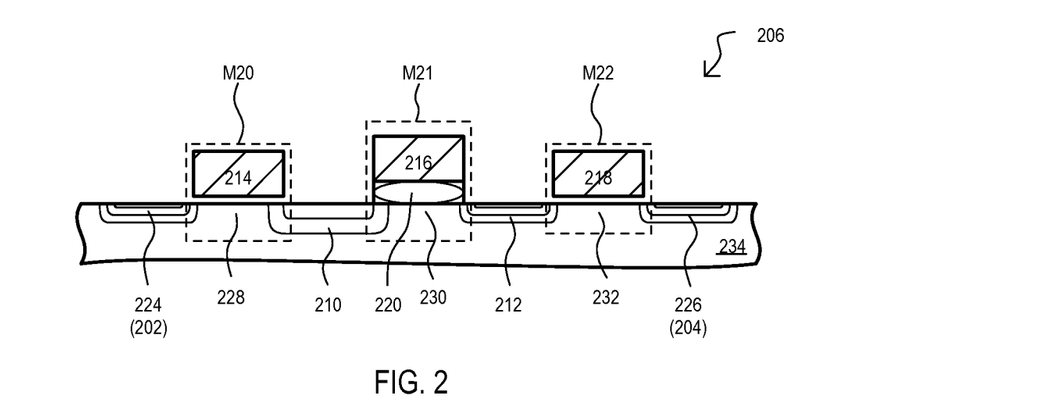
FIG. 2 is a side cross sectional view of a section of a memory cell according to another embodiment.

Referring still to FIG. 1, transistors M00, M01, M02, M03, M04, M05 can have control gates CTRL00, CTRL01, CTRL02, CTRL03, CTRL04, and CTRL05, respectively. For embodiments with two sections (106-0/1), control gate CTRL00 can be commonly connected to control gate CTRL03, control gate CTRL01 can be commonly connected to control gate CTRL04, and control gate CTRL02 can be commonly connected to control gate CTRL05, FIG. 2 is a side cross sectional view of a nonvolatile memory cell section 206 according to an embodiment. It is understood that a memory cell can include two such sections. In one embodiment, a memory cell section 206 can be one very particular implementation of that shown as 106-0 or 106-1 in FIG. 1.

A memory cell section 206 can include a first access transistor M20, programmable transistor M21, and second access transistor M22 with source-drain paths arranged in series with one another. Transistors M20, M21, M22 can be of the same conductivity type (e.g., n-channel or p-channel) and formed in a same active area of a semiconductor substrate 234.

First access transistor M20 can have a control gate 214, channel 228, first S/D diffusion region 224, and second diffusion region 210. Second S/D diffusion region 210 can be shared with programmable transistor M21. In some embodiments, first S/D diffusion region 224 can also be a supply node 202 common to another access transistor, of the same, or of a different memory cell.

Similarly, second access transistor M22 can have a control gate 218, channel 232, first S/D diffusion region 226, and a second S/D diffusion region 212. Second S/D diffusion region 212 can be shared with programmable transistor M21. In some embodiments, first S/D diffusion region 225 can also be a data node 204.

Programmable transistor M21 can have a control gate 216, channel 230, and storage structure 220 formed between the control gate 216 and channel 230. In some embodiments, a charge storage structure 220 can include insulating layers. However, in other embodiments a charge storage structure 220 can include a combination of insulating layers and one or more semiconductor and/or conductor layers.

According to embodiments, S/D diffusion region 210 can be different than second S/D diffusion region 212. In very particular embodiments, S/D diffusion region 210 can have a more graded junction than S/D diffusion region 212.

In addition or alternatively, second S/D diffusion region 210 can be different than first S/D diffusion region 224. In very particular embodiments, S/D diffusion region 210 can have a more graded junction than S/D diffusion 224.

In very particular embodiments, S/D diffusions regions 224, 212 and 226 can match one another, while S/D diffusion region 210 is different from the other S/D diffusion regions.

It is understood that FIG. 2 is intended to be a general representation of one embodiment, and should not be construed as limiting to the invention. Embodiments can have various S/D diffusion profiles, including those created by various dopant introduction steps, such as lightly doped drain (LDD) or HALO type implants. Similarly, control gates can include one or more spacer structures formed on their sides or overlying conductive layers (e.g., silicide) or insulating layer (e.g., gate capping layer).

Figure 3:
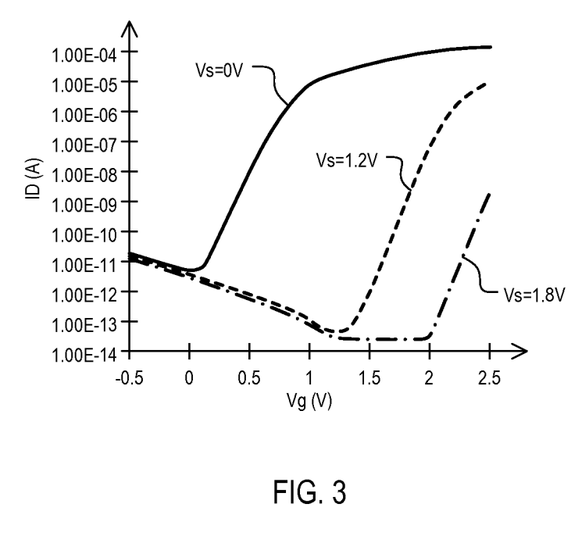
FIG. 3 is a graph showing how gate-induced-drain-leakage (GIDL) can cause dynamic write inhibit (DWI) disturb in a conventional nonvolatile static random access memory (NV SRAM) cell.

An investigation by the inventors into DWI disturb, as shown in FIGS. 12B-0/1, has discovered that DWI disturb is dominated by gate induced drain leakage (GIDL) through the recall transistor (i.e., M3 in FIG. 12A). In particular, GIDL through the recall transistor can be in the range of ~5 pA, while sub threshold leakage through the corresponding store transistor (i.e., M5 in FIG. 12A) is substantially smaller (i.e., <0.1 pA). FIG. 3 is a graph showing GIDL leakage through a recall transistor for various gate voltages (Vg) and source voltages (Vs). Such leakage can result in DWI disturb of a programmable transistor, such as SONOS type transistor.

Figure 4A:
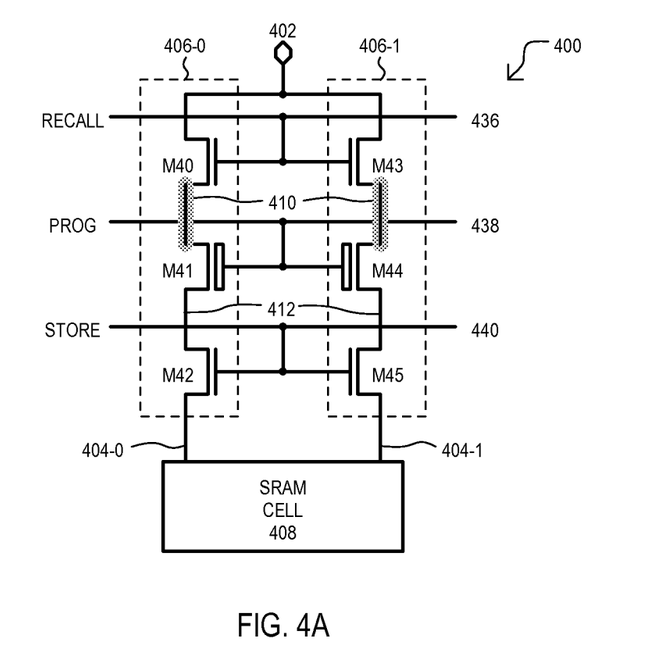
FIG. 4A is a block schematic diagram of a NV SRAM cell according to an embodiment.

FIG. 4A is a schematic diagram of a nonvolatile static random access memory (NV SRAM) cell 400 according to an embodiment. NV SRAM cell 400 can be one very particular implementation of that shown in FIG. 1. NV SRAM cell 400 can include a first section 406-0 between a supply node 402 and a first data node 404-0, and a second section 406-1 between a supply node 402 and a second data node 404-1.

Each section 406-0/1 can include a recall transistor M40/M43, a SONOS transistor M41/M44, and a store transistor M42/M45. In the particular embodiment shown, each of the transistors is an n-channel transistor. Recall transistors M40/M43 can have common control gates 436 that receive a recall signal RECALL. SONOS transistors M41/M44 can have common control gates 438 that receive a program signal PROG. Store transistors M42/M45 can have common control gates 440 that receive a store signal STORE.

Transistors M40/M43 share S/D diffusion regions 410 with SONOS transistors M41/M44, respectively. Similarly, transistors M42/M45 can share S/D diffusion regions 412 with SONOS transistors M41/M44, respectively. However, the shared S/D diffusion regions 410 of the recall transistors (M40/M43) have a more graded junctions than the S/D diffusion regions 412 of store transistors (M42/M45). The inclusion of graded junctions in S/D diffusion regions 410 has been found to reduce GIDL, and hence DWI disturb.

An SRAM cell 408 can latch a data value in a volatile fashion in response to a recall operation, which can establish voltages on data nodes 404-0/1 based on threshold voltages of SONOS transistors M41/M44. An SRAM cell 408 can take the form of any suitable SRAM cell, and in some embodiments, can include one or more devices for equalizing or pre-charging data nodes 404-0/1 to a same potential at the start of a recall operation.

While an embodiment like that of FIG. 4A can include two sections (406-0/1), alternate embodiments can include one section (i.e., are single ended with respect to a corresponding latch circuit). One such embodiment is shown in FIG. 4B.

Figure 4B:
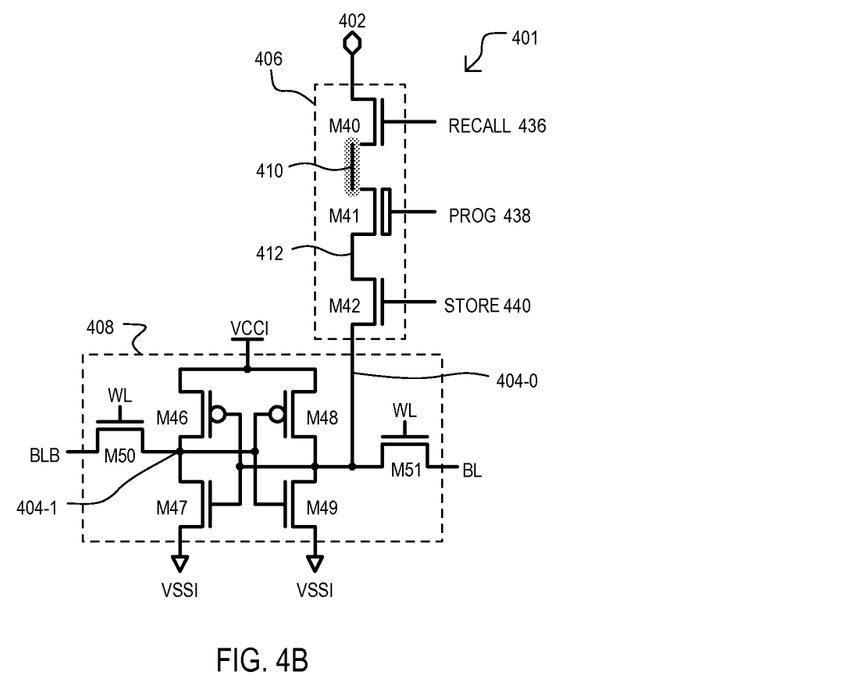
FIG. 4B is a schematic diagram of a NV SRAM cell according to another embodiment.

FIG. 4B is a schematic diagram of a NV SRAM cell 401 according to a further embodiment. NV SRAM 401 can include items like those of FIG. 4A, and such like items are referred to by the same reference characters.

The NV SRAM cell 401 differs from that of FIG. 4A in that it includes a single section 406 connected to one node 404-0 of an SRAM cell 408. Section 406 can include recall transistor M40, SONOS transistor M41, and store transistor M42. A diffusion region 410 shared by recall transistor M40 and SONOS transistor M41, can be different from diffusion region 412 shared by store transistor M42 and SONOS transistor M41.

SRAM cell 408 can be a six-transistor cell, having p-channel/n-channel transistor pairs (M46/M47 and M48/M49) cross-coupled with one another between data nodes 404-0/1. Access transistors M50/M51 can connect nodes 404-0/1 to bit lines BL/BLB, respectively. Based on a data value latched by SRAM cell 408 (e.g., written into the cell via bit lines BL/BLB), a threshold voltage of a SONOS transistor M41 can be set. Further, according to a threshold voltage of SONOS transistor M41, a data value can be recalled into SRAM cell 408.

Having described the various items of NV SRAM cell 401, a recall operation for the cell will now be described. SRAM cell 408 can be preset to a particular value. According to one embodiment, RECALL and STORE can be low, turning recall and store transistors (M40/M42) off. SRAM cell 401 can be written with a data value "1" (i.e., data node 404-0 will be at a high power supply voltage VCCI). In one particular embodiment, at this point, VCCI can be about 1.2 V.

A power supply for the SRAM cell 408 can then be lowered. The "latched high" data node 404-0 will follow this decrease in power supply voltage. In one particular embodiment, VCCI can be lowered to about 0.6 to 0.7 V.

A power supply node 402 can be driven to a low voltage (e.g., VSS). RECALL and STORE can then be turned on, and PROG driven to a predetermined voltage. In one particular embodiment, RECALL and STORE can be 2.5 V, while PROG can be 0 V.

If SONOS transistor M41 has a low threshold voltage (i.e., is erased), data node 404-0 will be driven low, establishing a data value "0" in the SRAM cell 408. If SONOS transistor M41 has a high threshold voltage (i.e., is programmed), data node 404-0 will be remain unchanged, and SRAM cell 408 can maintain its initial data value "1".

A power supply for the SRAM cell 408 can then be returned to the higher level, to fully latch the recalled data value. In one particular embodiment, VCCI can return to about 1.2 V.

Figure 5:
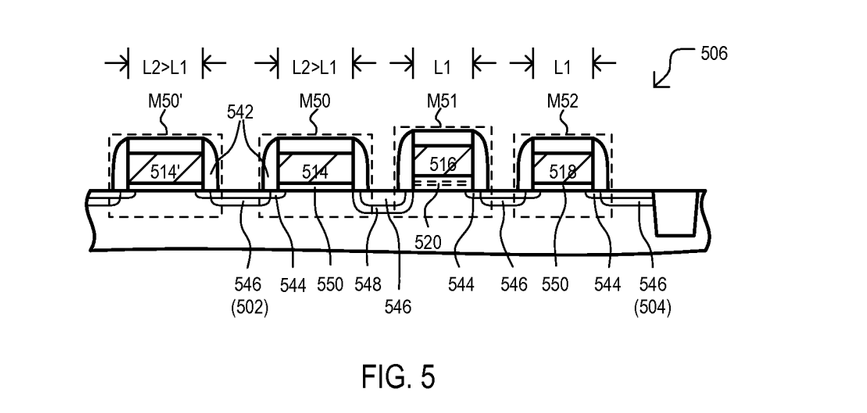
FIG. 5 is a side cross sectional view of a section of a NV SRAM cell according to an embodiment.

FIG. 5 is a side cross sectional view of a NV SRAM cell section 506 according to an embodiment. In one very particular embodiment, a memory cell section 506 can be one very particular implementation of that shown as 406-0/1 in FIGS. 4A and 4B.

A memory cell section 506 can include a recall transistor M50, SONOS transistor M51, and store transistor M52. (FIG. 5 also shows the recall transistor M50' of a different section, which can be part of a different memory cell). Transistors M50, M51, and M52 can have control gates 514, 516 and 518, as well as spacers (two shown as 542). Transistors M50 and M52 can have control gates (514/518) formed over gate dielectrics 550. SONOS transistor M51 can have a control gate 516 formed over a combination dielectric, which can include one or more charge storing layer(s)/interface(s) 520.

In the embodiment shown, a S/D diffusion region shared by store transistor M52 and SONOS transistor M51 can include a S/D implant region 546 and an LDD region 544. In contrast, a graded S/D diffusion region shared by recall transistor M50 and SONOS transistor M51 can include a S/D implant region 546 and a grade increasing implant region 548, and may not include a LDD implant region.

A more graded S/D diffusion region (e.g., 546/548) can greatly GIDL in the recall transistor M50 when a complementary SONOS device (not shown) is being programmed. However, at the same time, a more graded dopant profile can shorten an effective channel length of the recall transistor M50, resulting in a lower threshold voltage due to short-channel effects. Thus, according to some embodiments, a recall transistor M50 can also include have an increased in channel length (as compared to the corresponding store transistor M52 and/or SONOS transistor M51). Accordingly, in the embodiment shown, while a SONOS transistor M51 and store transistor M52 can have a channel length of L1, a recall transistor M50 can have channel length L2, which is longer than L1. However, in other embodiments, a channel length of SONOS transistor M51 can be different than store transistor M52 (i.e., can have a channel length L3).

As in the case of FIG. 2, a S/D diffusion region between recall transistors M50 and M50' can be a supply node 502. Further, a S/D diffusion region of store transistor M52 opposite to that of SONOS transistor M51 can be a data node 504.

Figure 6A:
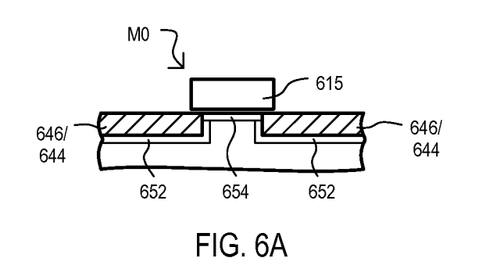
FIGS. 6A and 6B are transistor models of a conventional transistor and a recall transistor according to an embodiment.
Figure 6B:
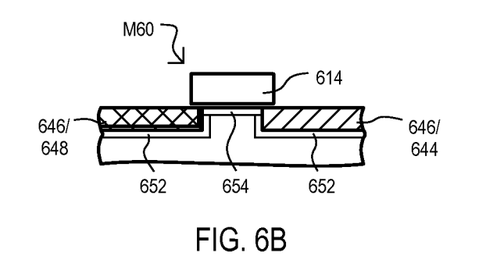

FIGS. 6A and 6B show technology computer aided design (TOAD) models that show reductions in recall transistor GIDL by inclusion of graded junction, according to a very particular embodiment. FIG. 6A shows a model of a conventional transistor M0 having symmetric S/D diffusion regions formed with a source/drain implant and an LDD implant (646/644). In addition, transistor M0 has a HALO implant 652 and a threshold voltage adjustment implant 654.

FIG. 6B shows a model of a recall transistor M60 according to an embodiment. A recall transistor M60 can include can include structures like those of FIG. 6A. However, unlike FIG. 6A, one S/D region is formed with a source/drain implant 646 and a special implant 648 of dopants having a faster diffusion rate. In the particular embodiment shown, such a dopant can be phosphorous. However, a more graded junction can be achieved with any suitable technique.

Figure 7:
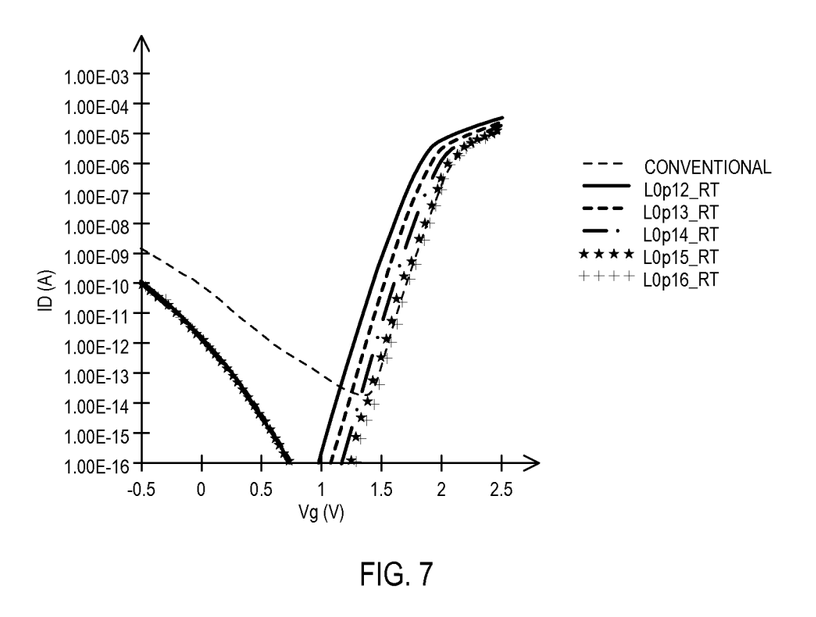
FIG. 7 is a graph showing simulation results for the models of FIGS. 6A and 6B that demonstrate how a graded source/drain (S/D) diffusion region in a recall transistor can reduce GIDL and hence reduce DWI disturb.

FIG. 7 is a graph showing simulation results for the models of FIGS. 6A and 6B. FIG. 7 shows GIDL leakage for the conventional transistor (shown as CONVENTIONAL), as well as a recall transistor according to an embodiment with different channel lengths.

As shown, GIDL can be reduced by up to 50× over the conventional approach.

Figure 8:
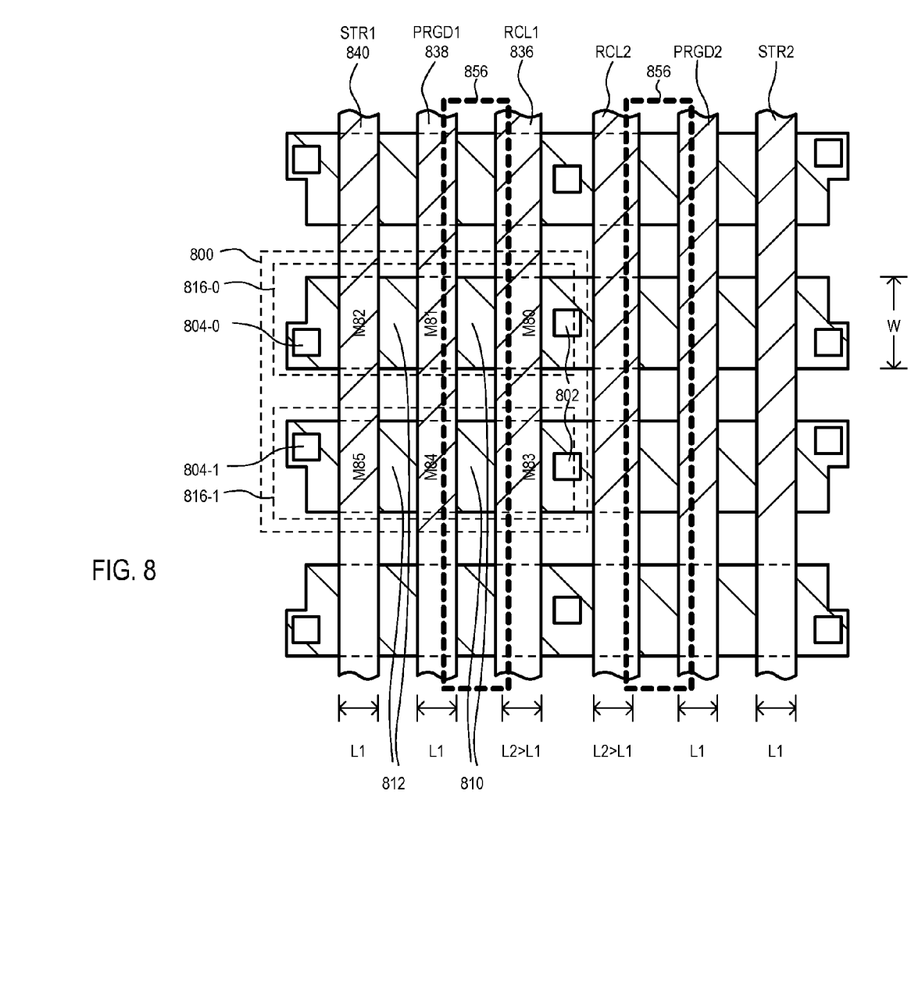
FIG. 8 is layout view of an integrated circuit device showing sections of NV SRAM cells, as well as mask openings for special ion implantation(s) to create a more graded junction for S/D regions between a SONOS device and its recall transistor.

FIG. 8 shows the layout and an implant mask for a section of an NV SRAM cell 800 according to an embodiment. FIG. 8 shows a first section 816-0 that includes a first recall transistor M80, first SONOS transistor M81, and first store transistor M82, as well as a second section 816-1 that includes a second recall transistor M83, second SONOS transistor M84, and second store transistor M85. A recall gate 836, program gate 838 and store gate 840 can be parallel to one another. Recall gate 836 can be common to multiple recall transistors (e.g., M83/M80), a program gate 838 can be common to multiple SONOS transistors (e.g., M81/M84), and a store gate 840 can be common to store transistors (M82/M85).

In one very particular embodiment, sections 816-0/1 can take the form of that shown in FIG. 5.

FIG. 8 shows how mask openings 856 can be used for special implant steps to create S/D diffusion regions 810 between recall gate 836 and SONOS gate 838 that are different than those between store gate 840 and SONOS gate 838. According to particular embodiments, faster diffusing dopants (as compared to those used to create S/D diffusion regions 812) can be implanted utilizing a mask with openings 856.

In the particular embodiment of FIG. 8, recall transistors can have a greater channel length (L2) than the channels of SONOS and store transistors (L1). As noted above, a SONOS gate 838 may be the same channel length as store gate 840 or different channel length from store gate 840.

FIG. 8 also shows contacts to a supply node 802, as well as contacts to a first data node 804-0 and a second data node 804-1. Further, recall, SONOS and store transistors of the same section can have a same channel width (W).

In some embodiments, a first section and second section 816-0/1 can be parts of different NV SRAM cells (i.e., the NV SRAM cells are "single-ended", with the section being connected to one data node of a volatile storage circuit). However, in other embodiments, a first section and second section 816-0/1 can be parts of the same NV SRAM cell (i.e., the NV SRAM cells are "differential", with sections being connected to complementary data nodes of a volatile storage circuit).

FIGS. 9A to 9D are side cross sectional views showing a method of forming a sections of an NV SRAM cell, like that shown in FIG. 5, according to an embodiment.

Figure 9A:
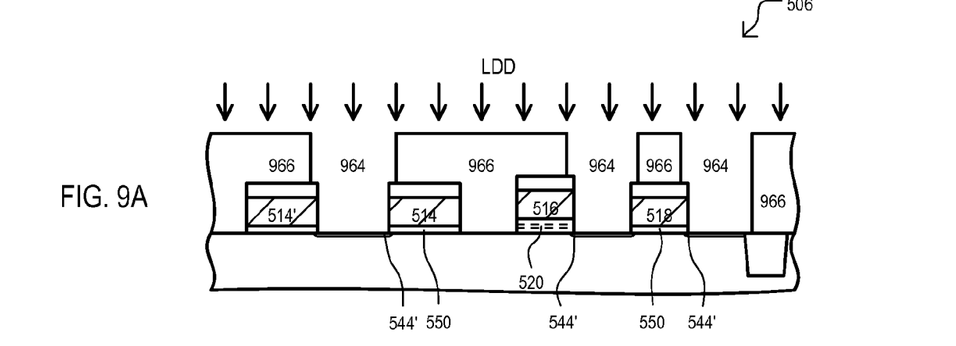
FIGS. 9A to 9D are a sequence of side cross sectional views showing a method of making a NV SRAM section like that of FIG. 5, according to one very particular embodiment.

FIG. 9A shows the formation of recall transistor control gates 514/514' and a store control gate 518 over gate dielectric (e.g., 550). Also shown is the formation of a SONOS gate 516 over a SONOS dielectric which can include one or more charge storing layers/interfaces 520.

FIG. 9A also shows the formation of mask 966 having openings 964 that expose S/D regions on either side of store gate 518, as well as the power supply S/D region for the recall gates (i.e., between recall gates 514/514'). At the same time, the S/D region between SONOS gate 516 and recall gate 514 can be covered by the mask 966. An LDD ion implantation can then take place. Accordingly, initial LDD regions 544' can be formed as shown.

Figure 9B:
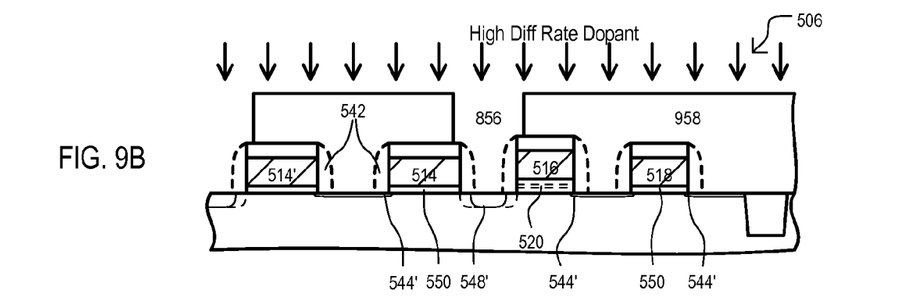

FIG. 9B shows the formation of mask 958 having openings 856 that only expose the S/D regions between recall gates 514/514' and their corresponding SONOS gate 516. An ion implantation of a fast diffusion rate dopant can then take place. In one embodiment, the transistors are n-channel transistors, and such an action can include one or more ion implantations of phosphorous. Accordingly, only a S/D regions between a recall gate 514/514' and its corresponding SONOS gate 516 can include an initial high diffusion rate regions 548'. In some embodiments, such a doping step can be performed without sidewalls (e.g., 542). However, in other embodiments, such a doping step can be performed with sidewalls.

Figure 9C:
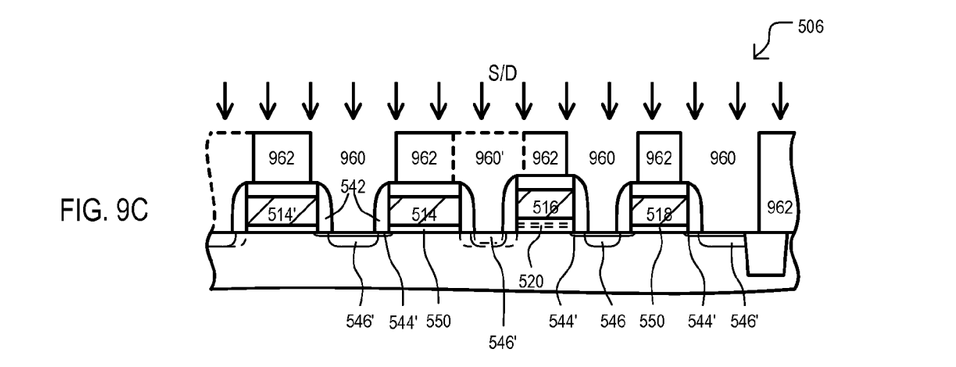

FIG. 9C shows the formation of sidewalls (e.g., 542, if not already formed) on the sides of control gates 514'/514/516/518. In addition, a mask 962 can be formed having openings 964 that expose all S/D regions between recall gates 514/514', SONOS gate 516, and store gate 518. A S/D ion implantation can then take place. Accordingly, all S/D regions of the section shown in FIG. 9B can include initial S/D regions 546'. In some embodiments, a S/D ion implantation may not occur between recall gates 514/514' and the corresponding SONOS gate 516 (i.e., a previous graded diffusion step may be sufficient to establish the S/D region)

Figure 9D:
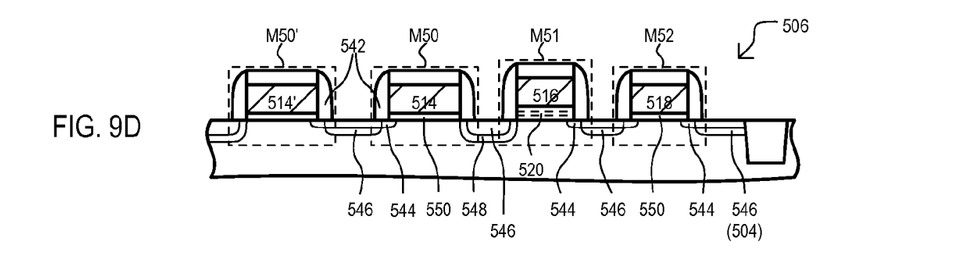

FIG. 9D shows a NV SRAM section 506 after heat treatments have resulted in the out diffusion of dopants in the S/D regions. Due to fast diffusion rate dopants, an S/D region between control gate 514 and its SONOS gate 516 can have a higher graded junction than that between the same SONOS gate 516 and its corresponding recall gate 518.

Figure 10A:
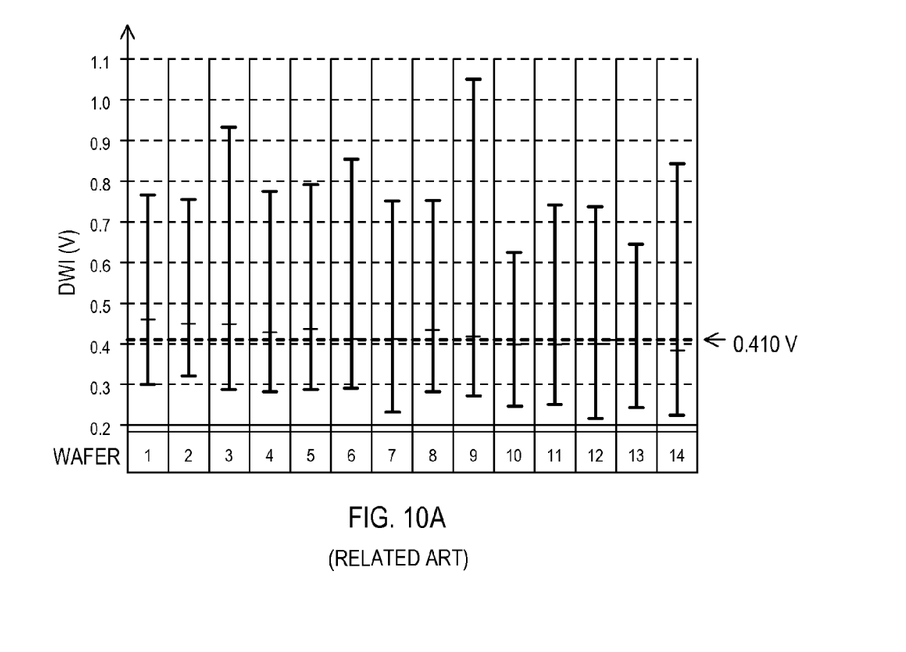
FIGS. 10A and 10B are variability diagrams showing a difference in DWI disturb between conventional NV SRAM cells and NV SRAM cells according to an embodiment.
Figure 10B:
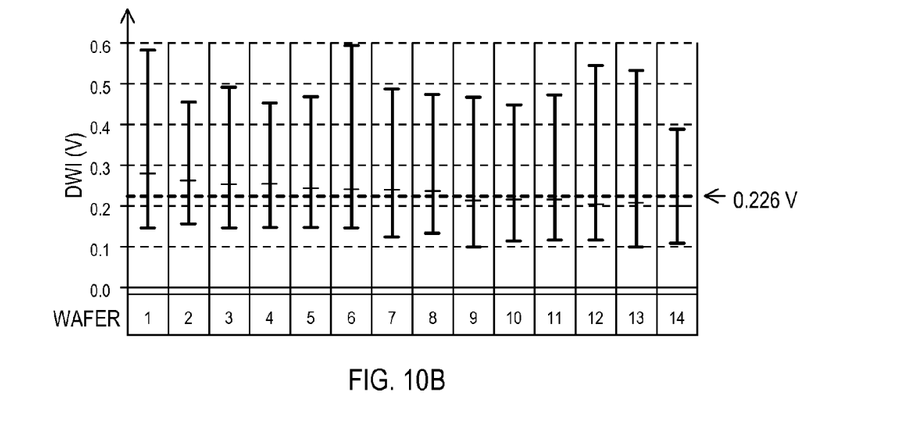

FIGS. 10A and 10B show DWI disturb variability for a conventional NV SRAM device, like that shown in FIG. 12C and one according to an embodiment like that of FIG. 8. In the conventional case of FIG. 10A, gate lengths for the recall, SONOS and store transistors were 120 nm. In contrast, in the embodiments of FIG. 10B, gate lengths for the SONOS and store transistors were 120 nm, while the gate length of the recall transistors were increased to 150 nm, to counteract short channel effects arising from the more graded junctions. FIGS. 10A and 10B show variability results for 14 wafers.

As shown, the median DWI disturb in the conventional case was 410 mV. In sharp contrast, the media disturb for the NV SRAMs according to an embodiment, was 226 mV.

Figure 11:
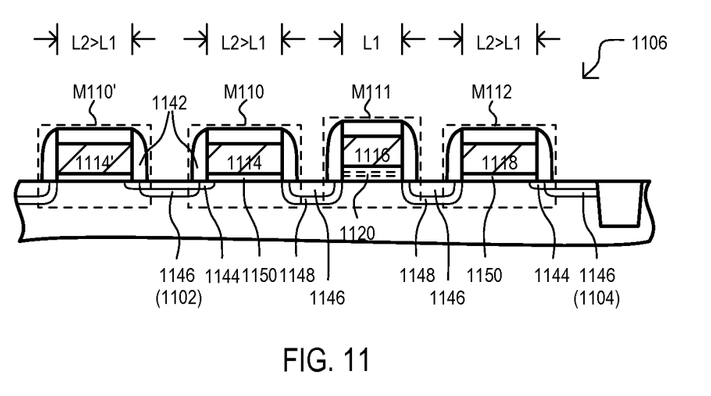
FIG. 11 is a side cross sectional view of a section of a NV SRAM cell according to an alternate embodiment.

FIG. 11 is a side cross sectional view of a nonvolatile memory cell section 1106 according to an alternate embodiment. FIG. 11 can include items like those of FIG. 5, and such like items are referred to by the same reference character but with the digit "11" substituted for "5".

The embodiment of FIG. 11 differs from that of FIG. 5 in that a S/D region between a store gate 1118 and a SONOS gate 1116 can have the same graded diffusion as that between the recall gate 1114 and the SONOS gate 1116. Thus, S/D diffusion regions on both sides of SONOS gate 1116 can have a more graded dopant profile than S/D diffusion regions on opposing sides of the recall and store gates (i.e., than diffusion regions corresponding to supply node 1102 and data node 1104).

In the particular embodiment of FIG. 11, a gate length of the store transistor M112 matches that of the recall transistor M114, to counteract reductions in threshold voltage arising from the more graded junction.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory cell, comprising:
at least a first programmable section coupled between a first supply node and a first data node;
a volatile storage circuit coupled to the first data node; and
the programmable section includes a programmable transistor having a first source/drain (S/D) region shared with a first access transistor, and a second S/D region shared with a second access transistor, wherein the first S/D region has a different dopant diffusion profile than the second S/D region and a more graded dopant p-n junction than the second S/D region, wherein a grade increasing region of the same conductivity type as the first S/D region contains the first S/D region, and the programmable transistor has a charge storage structure formed between its control gate and its channel.

2. The memory cell of claim 1, wherein:
the first access transistor has the one shared S/D region and another S/D region connected to the supply node.

3. The memory cell of claim 1, wherein:
the charge storage structure of each programmable transistor is selected from the group of: a charge storing dielectric structure and a conductive layer.

4. The memory cell of claim 1, wherein:
the first access transistor has a longer channel than each second access transistor.

5. The memory cell of claim 1, wherein:
the first access transistor, second access transistor and programmable transistor have a same channel width.

6. The memory cell of claim 1, wherein:
the volatile storage circuit comprises a latch circuit configured to store data in a volatile fashion on complementary latch nodes, a first of the latch nodes being coupled to the first data node.

7. The memory cell of claim 1, further including:
a second programmable section coupled between a second supply node and a second data node, the second programmable section including a second programmable transistor having a first S/D region shared with a third access transistor, and a second S/D region shared with a third access transistor.

* * * * *